United States Patent

[11] 3,560,810

[72] Inventors Pieter Balk
Katonah;
David W. Dong, Peekskill; Jerome M. Eldrige, Mahopac, N.Y.
[21] Appl. No. 752,897
[22] Filed Aug. 15, 1968
[45] Patented Feb. 2, 1971
[73] Assignee International Business Machines Corporation
Armonk, N.Y.
a corporation of New York

[54] FIELD EFFECT TRANSISTOR HAVING PASSIVATED GATE INSULATOR
12 Claims, 8 Drawing Figs.

[52] U.S. Cl. .......... 317/235, 117/215, 117/217
[51] Int. Cl. .......... H01l 11/14
[50] Field of Search .......... 317/235, 21.1, 46

[56] References Cited

UNITED STATES PATENTS

| | | | |
|---|---|---|---|
| 3,334,281 | 8/1967 | Ditrick | 317/235 |
| 3,476,619 | 11/1969 | Tolliver | 317/235 |

OTHER REFERENCES

IBM JOURNAL, "Stabilization of $SiO_2$ Passivation Layers with $P_2O_5$" by Kerr et al. Sept. 1964, pages 376–384

*Primary Examiner*—Jerry D. Craig
*Attorneys*—Hanifin and Jancin and S. P. Tedesco

ABSTRACT: An insulated-gate field effect transistor is described which includes a gate insulator defined as a laminate structure comprising a phosphosilicate glass (PSG) layer and a silicon dioxide ($SiO_2$) layer, the ratio of the thicknesses of such layers and, also, the $P_2O_5$ concentration in the PSG layer being properly chosen to insure stable device characteristics over extended periods under operation conditions.

INVENTORS
PIETER BALK
DAVID W. DONG
JEROME M. ELDRIDGE

BY S. P. Tedesco
ATTORNEY

FIELD EFFECT TRANSISTOR HAVING PASSIVATED GATE INSULATOR

BRIEF DESCRIPTION OF THE PRIOR ART

This invention relates to improved methods for manufacturing insulated-gate field effect transistors, and, more particularly, for fabricating insulated-gate field effect transistors having much improved stability. By stability is meant that the operating characteristics of the insulated-gate field effect transistors, e.g., threshold voltage $V_T$, do not change substantially under prolonged electrothermal stressing.

At the present time, industry is directing much effort toward the development of techniques and processes for batch-fabricating large numbers of solid-state components along with functional interconnections on a single substrate.

An example of a solid-state component suitable for batch fabrication is the insulated-gate field effect transistor. Basically, such field effect transistor comprises a metallic gate electrode spaced from the surface of a semiconductor material, e.g., silicon (Si), of first conductivity type by a thin layer of dielectric material, i.e., the gate insulator. In addition, source and drain electrodes are defined by diffused spaced portions of second conductivity type formed in the surface of the semiconductor wafer, the thin intermediate surface portion of the wafer defining a conduction channel. When the gate electrode is appropriately biased, the resulting electric fields modulate the carrier density along the conduction channel and, therefore, conduction between the source and drain electrodes. The operation of the insulated-gate field effect transistor closely approximates that of a vacuum tube triode since it is a voltage-controlled device and "working currents" between source and drain electrodes are supported only by majority carriers. Basically, the batch-fabrication of insulated-gate field effect transistors requires only a single diffusion step to form the source and drain electrodes, the structure being completed by forming a thin gate insulator over the conduction channel intermediate to such electrodes and the subsequent metallization of the gate electrode.

The operating characteristics exhibited by insulated-gate field effect transistors, e.g., threshold voltage $V_T$, are dependent upon space-charge effects which determine the Si surface potential, or the residual carrier density, at the Si-$SiO_2$ interface defining the conduction channel. The space-charge effects are due to an oxide charge which appears to build up in the gate insulator and, also, to alkaline ion migration, particularly sodium (Na), through the $SiO_2$ layer. The ability to control space-charge effects, particularly those which may arise after prolonged electrothermal stress, is a very pressing problem in the present technology. For example, variations of threshold voltage $V_T$ after prolonged use can cause circuit malfunction.

Accordingly, an object of this invention is to provide a novel insulated-gate field effect transistor having stable operating characteristics under prolonged operating conditions.

Another object of this invention is to provide a structure wherein the surface potential at a semiconductor-$SiO_2$ interface is precisely controlled under prolonged electrothermal stressing.

BRIEF SUMMARY OF THE INVENTION

Experience in the present technology has shown that the presence of a phosphosilicate glass (PSG) layer on a $SIO_2$ layer formed over a Si surface appears to stabilize, or passivate, the surface potential of such Si surface. The use of such PSG layer as a passivating layer in integrated semiconductor circuits has been described, for example, in the W.H. Miller, et al., U.S. Pat. No. 3,343,049, issued on Sept. 19, 1967, and assigned to a common assignee. This PSG layer, generally, has been formed by heating the $SiO_2$ layer in the presence of a phosphorus-oxygen compound, e.g., $P_2O_5$, $POCl_3$, etc; such compound reacts with the $SiO_2$ layer to form a layer of $P_2O_5$ - $SiO_2$ glass of unknown composition. During the diffusion process, the thickness of the PSG layer increases at the expense of the $SiO_2$ layer, the movement of the interface being diffusion controlled. It has been reported in "Stabilization of $SiO_2$ Passivation Layers with $P_2O_5$," by D.R. Kerr, et al., IBM Journal, Sept. 1964, pages 376—384, that the presence of the PSG layer increases the stability of the surface potential at the Si-$SiO_2$ interface by limiting positive space-charge build-up. It was later reported, for example, in "Ion Transport Phenomenon in Insulating Films," by E.H. Snow, et al., Journal of Applied Physics, May, 1965, pages 1664—1673, that such space-charge build-up is due to Na ions present within the $SiO_2$ layer. Alkaline ions present in an unpassivated $SiO_2$ layer tend to migrate within such layer when electrically stressed so as to vary space-charge effects at the Si-$SiO_2$ interface and, thus, in the conduction channel of the insulated-gate field effect transistor. Even when great care is exercised during the fabrication process, it is extremely difficult to avoid the presence of alkaline ions, particularly Na, in the $SiO_2$ layer.

A PSG layer formed over the $SiO_2$ layer appears to act as a getter, or sink, for alkaline ions and remove them from the $SiO_2$ layer whereby resulting space charge effects are reduced. Accordingly, the effectiveness of the PSG layer in reducing the effects of alkaline ion migration is inversely proportional to the ratio $x_g/_o$, where $_g$ is the thickness of the PSG layer and $_o$ is the thickness of the $SiO_2$ layer. However, notwithstanding the use of PSG layers, the problem of stability of insulated-gate field effect transistors has not been totally solved.

Subsequent investigation of the properties of the $SiO_2$ - $P_2O_5$ system has uncovered an electric polarization effect occuring within the PSG layer which appears to limit the stability of insulated-gate field effect transistors, or MOS structures. Such polarization effects, for example, have been reported in "-Polarization Phenomena and Other Properties of Phosphosilicate Glass Films on Si," by E.H. Snow, et al., Journal of the Electrochemical Society, Mar. 1966, pages 263—269. Such article reports that, although the PSG layer formed over a $SiO_2$ layer acts as an effective barrier to alkali ion migration, charge polarization observed in the PSG layer leads to pronounced instabilities in the characteristics of the MOS structures.

Charge polarization occurs in PSG layers under prolonged electrical stressing which deleteriously affect the Si surface potential and, hence, the operational characteristics of insulated-gate field effect transistors. As hereinafter described, such polarization effects can be explained phenomenologically as a dipolar reorientation and a charge motion due to a redistribution of nonbridging oxygen (O) ions in the $SiO_2$ $-P_2O_{a0}$ network. Under low temperature electrical stressing nonbridging O ions tend to drift between adjacent phosphorus groups having different charge centers, i.e., the individual groups act as dipoles oriented in the direction of applied electric fields. Under high temperature electrical stressing in addition to dipole reorientation, nonbridging O ions move freely through the $P_2O_5$ network under the influence of the applied electric fields. While the PSG layer tends to prevent alkali ion migration, it has introduced a new source of instability due to charge polarization which varies the Si surface potential and, hence, tends to shift the threshold voltage $V_T$ of the insulated-gate field effect transistor.

It is appreciated that the character of a $SiO_2$ layer, when properly annealed, is not subject to charge polarization when electrically stressed. Accordingly, oxide charge is concentrated in the PSG layer and, hence, the shift $\Delta V_T$ in threshold voltage is related to the ratio $x_g/x_o$, since compensating space charge induced along the conduction channel is reduced as the thickness $x_o$ is increased. In the prior art, it has been believed that charge polarization was an intrinsic effect in the PSG layer and that the threshold shift $\Delta V_T$ was only a function of $x_g/x_o$.

However, the present invention fully appreciates that the threshold shift $\Delta V_T$ is related to the ratio $x_g/x_o$ and, also, to the $P_2O_5$ concentration in the PSG layer. It has been established empirically that the threshold shift $\Delta V_T$ is given by the expression:

$$\Delta V_T \simeq -K\frac{x_g}{x_o}N^2V_b$$

where K is a constant of proportionality, and $N$ is the mole fraction of $P_2O_5$ in the PSG layer, and $V_b$ is gate bias voltage. In accordance with the present invention, the mole fraction of $P_2O_5$ in the PSG layer is reduced to within a critical range, the upper limit being .09 to minimize charge polarization and the lower limit being given by:

$$N=2\cdot10^{-4}\left(\frac{x_o}{x_g}+1\right)$$

to provide an effective barrier to alkali ion migration.

In such event, the susceptibility of the PSG layer to polarize under prolonged high temperature electrical stressing is very substantially reduced. Also, the ratio $x_g/x_o$ and the $P_2O_5$ concentration in the PSG layer are related in accordance with the thickness of the PSG-$SiO_2$ gate insulator. Having once determined the maximum allowable threshold shift $\Delta V_T$ and appreciating that the magnitude of the polarization is dependent upon the composition of the PSG layer, the ratio $x_g/x_o$ for a given $P_2O_5$ concentration or, alternatively, the $P_2O_5$ concentration for a given ratio $x_g/x_o$ is chosen so as to maintain variations in the space charge along the Si surface, i.e., the threshold shift $\Delta V_T$, within tolerable limits even under prolonged high temperature electrical stressing.

The foregoing and other objects, features, and advantages of the invention will be apparent from the following more particular description of preferred embodiments of the invention as illustrated in the accompanying drawings.

DESCRIPTION OF THE INVENTION

FIGS. 1A—1D illustrate certain intermediate steps in a process for fabricating an insulated-gate field effect transistor; it is evident that a plurality of such devices, either of the $n$-channel or $p$-channel type, can be fabricated concurrently on a single semiconductor wafer. The fabrication process has been more completely described, for example, in the G. Cheroff, et al., U.S. Pat. application Ser. No. 468,481, filed on Jun. 30, 1965 now U.S. Pat. No. 3,445,924 and assigned to a common assignee.

Figures 1A, 1B, 1C, 1D, 2:
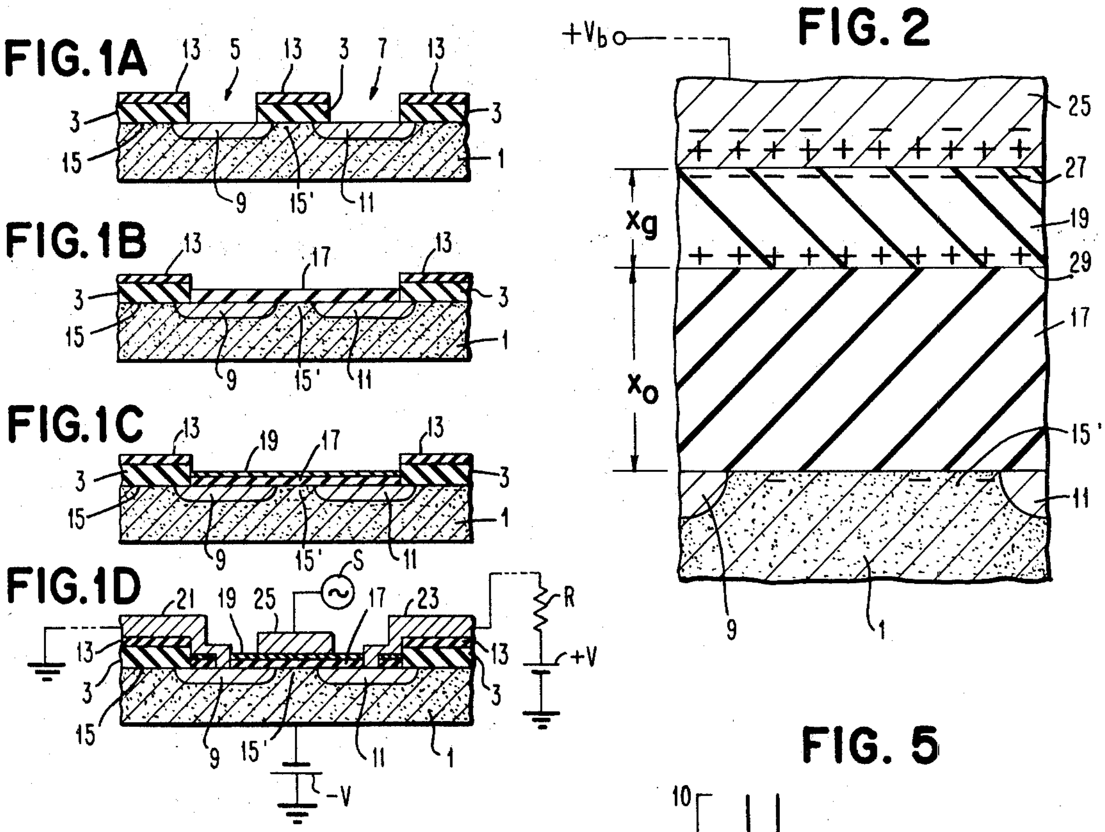
FIGS. 1A—1D show particular steps in the fabrication of an insulated-gate field effect transistor in accordance with the present invention.
FIG. 2 shows a partial cross-sectional view of the insulated-gate field effect transistor of FIG. 1D under positive gate bias conditions.

In FIG. 1A, a $p$-type silicon wafer 1 has been mechanically lapped and chemically polished by conventional techniques to insure removal of all foreign surface contaminants. Actual fabrication is commenced by subjecting, at least, the top surface of wafer 1 to an oxidation process to form a thick $SiO_2$ layer 3. For example, wafer 1 can be subjected to a dry-wet-dry process which includes exposing wafer 1 successively to an oxygen ($O_2$), water vapor ($H_2O$), and oxygen ($O_2$) ambient while maintained at an elevated temperature, e.g., at 960° C. Usually, $SiO_2$ layer 3 is formed of a thickness between 2,000A and 7,000A, and can be utilized as a mask for the source-drain diffusion. For example, diffusion windows 5 and 7 are defined in $SiO_2$ layer 3 by photolithographic etching techniques to expose particular surface portions of wafer 1.

To form $n$-type source and drain diffusions 9 and 11, wafer 1 having preformed $SiO_2$ layer 3 on one surface is exposed to a gaseous phosphorus diffusant. Wafer 1 is maintained at an elevated temperature, e.g. 870° C., such that a thin layer, not shown, of a phosphorus-silicon-oxygen compound forms on all exposed surfaces of wafer 1 and $SiO_2$ layer 3. Subsequently, wafer 1 is heated to a more elevated temperature, e.g., between 1,000° C. and 1,300° C., whereby the phosphorus-silicon-oxygen layer in the source and drain areas is partially decomposed and phosphorus is diffused into the exposed surfaces of wafer 1 to form source and drain diffusions 9 and 11. At the same time, $P_2O_5$ diffuses into the surface of $SiO_2$ layer 3 to form the final phosphosilicate glass (PSG) layer 13. Since PSG layer 13 and source and drain diffusions 9 and 11 are effected by the same diffusion process, the required depth and impurity density of source and drain electrodes 9 and 11 is controlling. Accordingly, the $P_2O_5$ concentration in PSG layer 13 is high, for example, well in excess of 10 mole percent, and, therefore, subject to pronounced charge polarization according to the mechanism hereinafter described; also, the thickness of PSG layer cannot be independently controlled. Space-charge effects along Si surface 15 at the Si-$SiO_2$ interface are not critical and can be compensated by conventional substrate biasing techniques, as hereinafter described with respect to FIG. 1D.

When source and drain diffusions 9 and 11 have been formed, the wafer is subjected to a gate-stripping process and formation of the final gate insulator 17, as shown in FIG. 1B. Conventionally, portions of oxide layer 3, along with PSG layer 13, form over surface of wafer 1 intermediate source and drain diffusions 9 and 11, i.e., conduction channel 15′. Wafer 1 is subjected to a reoxidation step, as illustrated in FIG. 1B, by exposure to an $O_2$ ambient at an elevated temperature between 900° C. and 1,150° C. During the reoxidation process, penetration of source and drain electrodes 9 and 11 along with the thickness $x_g$ of PSG layer 13 are increased, the latter being at the expense of $SiO_2$ layer 3. In addition, thin $SiO_2$ layer 17 is formed over the exposed surface of wafer 1 intermediate source and drain diffusions 9 and 11. Thin $SiO_2$ layer 17, which defines the gate insulator in the ultimate device structure, is preferably formed of a reduced thickness, e.g., between 200A and 1,000A, whereby capacitive effects for modulating minority carrier density along conduction channel 15′ and, hence, transconductance $g_m$, are enhanced.

In accordance with the particular aspects of this invention, passivating PSG layer 19, formed over conduction channel 15′, has a $P_2O_5$ concentration which is controlled within a particular range. PSG layers have been formed over the gate insulators of prior art field effect transistors; however, the $P_2O_5$ concentration in such layers was excessive and space-charge effects, i.e., surface potential changes resulting from charge polarization in the PSG layer, were frequently greater in magnitude than the effects that were eliminated by the prevention of alkali ion migration within the gate insulator. In accordance with particular aspects of this invention, and subsequent to the formation of thin $SiO_2$ layer 17, wafer 1 is again exposed to a gaseous atmosphere of appropriate dopant material but of lesser concentration than that described with respect to FIG. 1A. For example, $POCl_3 + O_2$ can be transported along in a nitrogen carrier over wafer 1 which is maintained at an elevated temperature, e.g., 800° C., so as to form a thin layer of a phosphorus-silicon-oxygen compound, not shown, over exposed surfaces of PSG layer 13 and thin $SiO_2$ layer 17. Wafer 1 is elevated to a temperature of approximately 1,000° C. in a neutral ambient for a time sufficient to diffuse $P_2O_5$ into thin $SiO_2$ layer 17 and form thin PSG layer 19; also, the $P_2O_5$ concentration and thickness of PSG layer 13 is increased slightly. The diffusion parameters are controlled so as to establish a proper ratio $x_g/x_o$ for PSG layer 19 and thin $SiO_2$ layer 17 and provide a given $P_2O_5$ concentration, as hereinafter described, so as to contain the threshold shift $\Delta V_T$ within acceptable limits.

The fabrication process is completed as shown in FIG. 1D by a metallization step to define source and drain contacts 21 and 23 and, also, gate electrode 25 which is registered over conduction channel 15′. Initially, access openings are provided within thin oxide layer 17 by conventional photolithographic etching techniques to expose surface portions of source and drain diffusions 9 and 11. Subsequently, a continuous metallic layer, e.g., of aluminum, is deposited over the entire surface of wafer 1 which extends through the access openings in layer 17 to ohmically contact source and drain diffusions 9 and 11. Gate electrode 25 along with the necessary functional interconnection pattern between various field effect transistors formed on wafer 1 are concurrently defined by conventional photolithographic etching techniques. Schematically, the final structure, as shown in FIG. 1D, is connected in circuit arrangement, for example, by connecting source contact 21 to ground, drain contact 23 to an appropriate voltage source +V through a load R, and gate electrode 25 to an input signal source S via the functional interconnection pattern. Also, wafer 1 is biased negatively as shown, by voltage source −V so as to deplete any inversion layer along the Si surface 15 at Si-$SiO_2$ interface due to space-charge effects.

To more fully understand the manner in which space-charge effects are controlled so as to stabilize the threshold voltage $V_T$, reference is made to FIG. 2 which shows an enlarged cross-sectional view of the gate region of the structure of FIG. D. Succinctly stated, space-charge effects are controlled by limiting the $P_2O_5$ concentration in PSG layer 19 and also, by determining the thickness $x_g$ of the PSG layer 19 with respect to the thickness $xo$ of $SiO_2$ layer 17. The model proposes a charge redistribution within the PSG layer 19 under electrothermal stressing. Under low temperature electrical stressing, dipolar reorientation occurs in the network of PSG layer 19 due to the drift of nonbridging O ions between opposite charge centers. Under high temperature electrical stressing, O ions migrate throughout the network of PSG layer 19 and, under positive gate bias, tend to accumulate at PSG-metal interface 27. There does not seem to be a charge polarization within thin $SiO_2$ layer 17 since thermally grown $SiO_2$, when properly annealed, consists of a network of $SiO_4$ tetrahedra which is chemically saturated. On the other hand, since $PO_4$ tetrahedra have been substituted for $SiO_4$ tetrahedra in PSG layer 19, a nonbridging O ion is associated with every other phosphorus atom, such phosphorus atoms being randomly distributed throughout the network. However, the ability of nonbridging O ions to drift between charge centers is a function of the distance between such charge centers, i.e., the $P_2O_5$ concentration, and, also, the amount of electrothermal stressing to which the PSG layer is subjected, i.e., bias voltage $v_b$. The drifting of nonbridging O ions between charge centers has a dipolar effect whereby space charge of opposite polarity appears to concentrate along opposite major surfaces of PSG layer 19, as illustrated in FIG. 2.

For a random solution, the probability of two centers of opposite charge being in close proximity in the PSG network has a quadratic dependence on the $P_2O_5$ concentration in PSG layer 19. This quadratic dependence on the $P_2O_5$ concentration in PSG layer 19 holds only for relatively dilute solutions; for more concentrated solutions, this dependence will deviate from a quadratic relationship for simple statistical reasons.

Since charge polarization is limited to the PSG layer 19, the ratio $x_g/x_o$ is a controlling parameter. The effects of charge polarization are to induce compensating space charge along the conduction channel 15′ so as to shift the threshold voltage $v_T$. For example, the negative space charge polarized along the upper surface of PSG layer 19 is almost totally compensated along the adjoining surface of gate electrode 25. However, with respect to the positive charge polarized along the PSG-$SiO_2$ interface 29, a compensating space charge is induced in both gate electrode 25 and conduction channel 15′. The amount of compensating space charge along conduction channel 15′ is given by:

$$\frac{x_g Q}{x_o + x_g}$$

where $Q$ is the total polarized space charge along PSG-$SiO_2$ interface 29. It has been found empirically that the magnitude of the space-charge effects, or threshold shift $\Delta V_T$, has a linear dependence on the ratio $x_g/x_o$. The threshold shift $\Delta V_T$, since due to the dipolar reorientation and, also, charge migration in PSG layer 19, reaches an upper, or saturated, limit which is primarily dependent upon gate bias voltage $V_b$. The rate at which the threshold voltage $V_T$ saturates, however, is temperature dependent since dipole reorientation and charge migration are thermally activated processes.

Figures 3, 4:
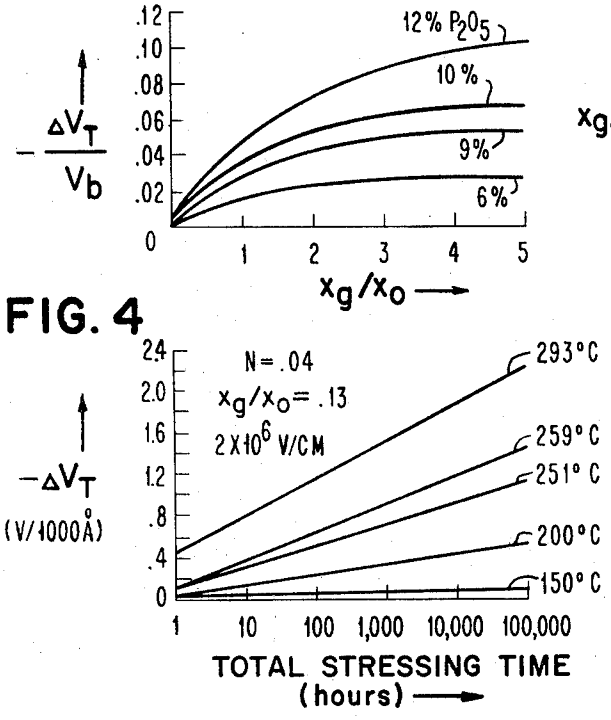
FIG. 3 shows the total threshold shift $\Delta V_T$ under low temperature electrical stressing plotted as a function of ratio $x_g/x_o$ for various $P_2O_5$ concentrations in the PSG layer.
FIG. 4 shows variations of $\Delta V_T$ under various conditions of prolonged high-temperature electrical stressing.

Under low temperature electrical stressing, threshold shift $\Delta V_T$, for a given ratio $x_g/x_o$ and $P_2O_5$ concentration in PSG layer 19, due to dipolar reorientation is realized very rapidly, usually within 1 hour; under such conditions, the magnitude of threshold shift $\Delta V_T$ increases as a function of the $P_2O_5$ concentration in PSG layer 19 and tends to saturate, as shown in FIG. 3. However, threshold shift $\Delta V_T$ is further affected when the structure is subjected to high temperature electrical stressing due to charge migration in PSG layer 19, as shown in FIG. 4, the level at which the threshold voltage $V_T$ stabilizes being singularly dependent upon the magnitude of the gate bias voltage $V_b$. The time required for the threshold voltage $V_T$ to stabilize, however, is a function of the ambient temperature. Variations in the threshold shift $\Delta V_T$ under prolonged high temperature electrical stressing is given by the expression:

$$\Delta V_T = \Delta V_{T_0} + A \log t$$

where $\Delta V_{T_0}$ contains the threshold shift due to low temperature electrical stressing, which is caused by dipolar reorientation, $t \geqq 1$ hour, and A is a constant of proportionality multiplied by $(N_{P_2O_5})^n$ where $n$ is at least greater then 2.

Referring particularly to FIG. 3, threshold shift $\Delta V_T$ (normalized with respect to gate bias voltage $V_b$) *is plotted as a function of the ratio* $x_g/x_o$ for the different percentages of $P_2O_5$ concentration in PSG layer 19 under low temperature electrical stressing. The observed values of threshold shift $\Delta V_T$ are seen to saturate at different values as a function of $x_g/x_o$ for given values of the $P_2O_5$ concentration in PSG layer 19. Such saturation occurs very rapidly due to dipolar orientation, generally in less than 1 hour and at low values of temperature, e.g., in the range of 40° C. and up. FIG. 3 indicates that, under low temperature electrical stressing, the threshold shift $\Delta V_T$ saturates at a level which is dependent upon the ratio $x_g/x_o$ and, also, the $P_2O_5$ concentration. The leveling off of the curves in FIG. 3 as the ratio of $x_g/x_o$ is increased indicates that the charge accumulated in PSG layer 19 along PSG-$SiO_2$ interface 29 is substantially totally compensated along conduction channel 15′, i.e., when $$\frac{x_g}{x_g + x_o} \rightarrow 1$$

Threshold shift $\Delta V_T$ as affected under high temperature electrical stressing is shown in FIG. 4. Actually, the effects depicted in FIG. 3 are part of the effects depicted in FIG. 4. In addition, FIG. 4 depicts those space-charge effects due to charge motion. For example, the threshold shift $\Delta V_T$ after 1 hour, as shown, is due to the composite effect of dipole reorientation resulting from low temperature electrical stressing and, also, charge motion resulting from high temperature electrical stressing; the differences between curves in FIGS. 3 and 4 are due to amount of charge motion in PSG layer 19 which is dependent upon temperature at which the insulated-gate field effect transistor is operated. Again, the number of nonbridging O ions in the network of PSG layer 19 and, hence, the accumulated space charge along PSG-$SiO_2$ interface 27 is dependent upon the $P_2O_5$ concentration in PSG layer 19. In FIG. 4, the slope of each individual curve is singularly determined by the temperature to which the device is subject while electrically stressed at a given gate bias voltage $V_b$. Since a semilog plot is shown in FIG. 4, it will be appreciated that the threshold shift s$\Delta V_T$ will effectively saturate at a given value which is singularly determined by the gate bias voltage $V_b$ and after a time dependent upon the thermal stress to which PSG layer 19 is subjected. Normally, a field effect transistor device would be operated at temperatures less that that of 100° C. As shown in FIG. 4, for temperatures of 150° C. or less, for a $P_2O_5$ concentration in PSG layer of 4 mole percent and $x_g/x_o$=.13, and a combined thickness of PSG layer 19 and $SiO_2$ layer 17 of 1,000A, the total threshold shift $\Delta V_T$ after $10^5$ hours can be expected to be substantially less than −0.2 volts, for $V_b$+20 volts. In the event that the $P_2O_5$ concentration is less than 9 mole percent, a threshold shift $\Delta V_T$ of less than −0.3 volts/1000A would be obtained.

When the mole fraction of $P_2O_5$ is less than .09, charge polarization in PSG layer 19 is substantially determined only by dipolar reorientation; charge motion, even under prolonged high temperature electrical stressing, is very substantially reduced. Preferably, the mole fraction of $P_2O_5$ in PSG layer 19 should be, at least, sufficient to block alkali ion migration, i.e., $N$ should be at least in excess of:

$$2\cdot 10^{-4}\left(\frac{x_o}{x_g}+1\right)$$

When such condition is met, space charge effects along conduction channel 15′ are very substantially reduced and threshold shift $\Delta V_T$ is controlled by proper selection of $x_g/x_o$ and the $P_2O_5$ concentration (cf. FIG. 3). Also, when the $P_2O_5$ concentration in PSG layer 19 has been determined, the particular ratio $x_g/x_o$ can be calculated; preferably, the ratio $x_g/x_o$ is, for practical reasons, selected to be not in excess of 3 to avoid contamination of the underlying Si surface, i.e., conduction channel 15′ during diffusion of PSG layer 19.

Figure 5:
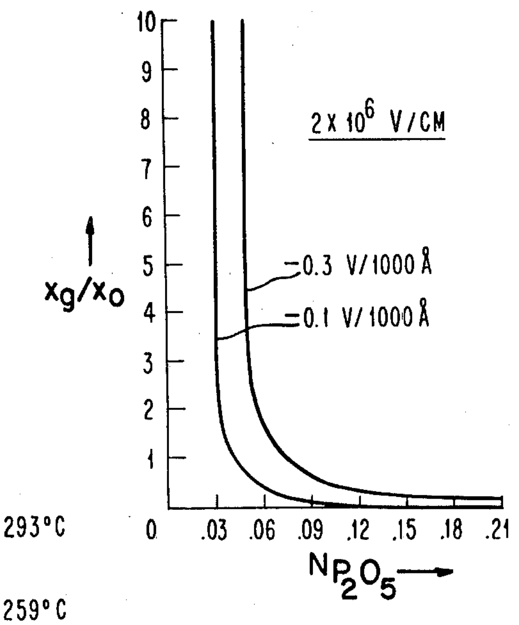
FIG. 5 shows the ratio $x_g/x_o$ plotted as a function of $P_2O_5$ concentration in the PSG layer to obtain particular values of threshold shift $\Delta V_T$.

The present invention appreciates that the polarizability $\chi$ of PSG layer 19 is given by the expression $\chi=mN^2$, where $m$ is a constant of proportionality which has been determined experimentally to be equal to 30. From electrostatic principles for layered dielectric structures, therefore, the threshold shift $\Delta V_T$ of an insulated gate field effect transistor including PSG layer 19 is given by:

$$\Delta V_T = -\frac{x_g \chi V_b}{(E+\chi)x_o + Ex_g} = -\frac{mN^2V_b x_g/x_o}{E+mN^2+Ex_g/x_o}$$

where E is the composite dielectric constant of the gate insulator, i.e., the dielectric constants of PSG layer 19 and $SiO_2$ layer 19 are both equal to approximately 4. In FIG. 5 curves are shown which describe points of equal threshold shifts $\Delta V_T$ of −0.3 $V$/1000A and −0.1 $V$/1000A, respectively, under constant stressing fields of $2\times10^6$ $V$/cm. at 100° C. A threshold shift of approximately −0.3$V$/1000A has been established as a maximum permissible threshold shift $\Delta V_T$ for circuit applications. Additional curves, each connecting points of equal threshold shift $\Delta V_T$, can be obtained by plotting of $x_g/x_o$ and $N$ values for particular values of $V_b$ in accordance with the following expression:

$$\frac{x_g}{x_o} = -\frac{mN^2+E}{E+mN^2V_b/\Delta V_T}$$

When the mole fraction of $P_2O_5$ is equal to or less than .09, charge polarization is essentially determined only by dipolar reorientation in PSG layer 19. Insulated gate field effect transistors having a ratio $x_g/x_o$ and a $P_2O_5$ mole fraction in PSG layer 19 less than .09, for example, describing a point to the left of the −0.3$v$/1000A) curve shown in FIG. 5, are essentially stabilized over very prolonged periods of operation.

While the invention has been particularly shown and described with reference to preferred embodiments thereof, it will be understood by those skilled in the art that various changes in form and details may be made therein without departing from the spirit and scope of the invention.

We claim:

1. An insulated-gate field effect transistor comprising:
 a semiconductor body of first conductivity type having a major planar surface and spaced source and drain diffusion of second conductivity type formed in said surface, portions of said surface intermediate said source and drain diffusions defining conduction channel;
 a thin layer of dielectric material formed over at least said conduction channel;
 a gate electrode formed over said dielectric layer in electric-field-applying relationship with said conduction channel and biased at a maximum voltage $V_b$;
 the improvement comprising a thin layer of phosphosilicate glass having a thickness $x_g$ included in said dielectric layer and extending in a plane substantially parallel to said surface; and
 a portion of said dielectric layer having a thickness $x_0$ interposed between said surface and said glass layer, said glass layer having a $P_2O_5$ concentration $N$ related to the ratio $x_g/x_0$ $$0.3V \geqq \frac{mN^2V_b x_g/x_o}{E+mN^2+Ex_g/x_o}$$

where $E$ is the composite dielectric constant of said interpositioned portion of said dielectric layer and said glass layer and $m$ is a constant of proportionality equal to 30 where $N$ is less than 0.09 and the ratio $x_g/x_o$ does not exceed 3.

2. An insulated-gate field effect transistor comprising:
 a semiconductor body of first conductivity type having a major planar surface and spaced source and drain diffusions of second conductivity type formed in said surface, portions of said surface intermediate said source and drain diffusions defining a conduction channel;
 a thin layer of dielectric material formed over at least said surface portions defining said conduction channel;
 a gate electrode formed over said thin dielectric layers in field-applying relationship with said surface portions defining said conduction channel; and
 the improvement comprising a thin layer of phosphosilicate glass included in said thin dielectric layer and extending in a plane substantially parallel to and noncontiguous with said surface portions defining said conduction channel, said glass layer having a mole fraction of $P_2O_5$ of less than 0.09 and wherein the ratio of the thickness $x_g$ of said glass layer to the thickness $x_o$ of said dielectric layer intermediate said glass layer and said surface does not exceed 3.

3. A field effect transistor as defined in claim 2 wherein said body is formed of $n$-type silicon.

4. An insulated-gate field effect transistor as defined in claim 2 wherein said body is formed of $p$-type silicon.

5. An insulated-gate field effect transistor as defined in claim 2 wherein said thin dielectric layer is formed of silicon dioxide.

6. An insulated-gate field effect transistor as defined in claim 2 wherein said glass layer has a $P_2O_5$ concentration less than 6 mole percent.

7. An insulated-gate field effect transistor as defined in claim 2 wherein the ratio of thickness $x_g$ of said glass layer to the thickness $x_0$ of said dielectric layer intermediate said glass layer and said surface does not exceed 1.

8. An insulated-gate field effect transistor as defined in claim 2 wherein the mole fraction of $P_2O_5$ in said glass layer is greater than $$2\times10^{-4}\left(\frac{x_o}{x_g}+1\right)$$

9. An insulated-gate field effect transistor as defined in claim 2 wherein the ratio of the thickness $x_g$ of said glass layer to the thickness $x_o$ of said dielectric layer intermediate said glass layer and said surface portion is less than 1 and the mole fraction of $P_2O_5$ in said glass layer is between $$2\times10^{-4}\left(\frac{x_o}{x_g}+1\right)$$

and 0.09

10. An insulated-gate field effect transistor as defined in claim 2 wherein the ratio of the thickness $x_g$ of said glass layer to the thickness $x_o$ of said dielectric layer intermediate said glass layer and said surface is less than 1 and the mole fraction of $P_2O_5$ in said glass layer is between $$2\times 10^{-4}\left(\frac{x_o}{x_g}+1\right)$$

and 0.06.

11. An insulated-gate field effect transistor as defined in claim 2 wherein the mole fraction of $P_2O_5$ in said glass layer is between $$2\times 10^{-4}\left(\frac{x_o}{x_g}+1\right)$$

and 0.06.

12. An insulated-gate field effect transistor as defined in claim 2 wherein the combined thickness of said glass layer and said dielectric layer intermediate said glass layer and said surface is between 200 and 1,000Å